(12) United States Patent
Takekuma

(10) Patent No.: US 6,940,102 B2
(45) Date of Patent: Sep. 6, 2005

(54) LIGHT-EMITTING DIODE AND A METHOD FOR ITS MANUFACTURE

(75) Inventor: Akira Takekuma, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 139 days.

(21) Appl. No.: 10/071,987

(22) Filed: Feb. 8, 2002

(65) Prior Publication Data

US 2002/0158320 A1 Oct. 31, 2002

(30) Foreign Application Priority Data

Feb. 13, 2001 (JP) ........................................ 2001-035317

(51) Int. Cl.[7] .......................... H01L 21/52; H01L 29/40; H01L 31/024
(52) U.S. Cl. .......................................... 257/99; 438/26
(58) Field of Search .............................. 257/79, 81, 82, 257/84, 95, 98, 99, 100; 438/23, 24, 25, 26, 27, 29

(56) References Cited

U.S. PATENT DOCUMENTS

| | | | | |
|---|---|---|---|---|
| 4,935,665 A | * | 6/1990 | Murata | 313/500 |
| 5,564,819 A | * | 10/1996 | Yamaguchi | 362/241 |
| 5,660,461 A | * | 8/1997 | Ignatius et al. | 362/241 |
| 5,914,501 A | * | 6/1999 | Antle et al. | 257/99 |
| 6,313,525 B1 | * | 11/2001 | Sasano | 257/704 |
| 6,331,063 B1 | * | 12/2001 | Kamada et al. | 362/237 |
| 6,614,103 B1 | * | 9/2003 | Durocher et al. | 257/678 |

FOREIGN PATENT DOCUMENTS

| | | | |
|---|---|---|---|
| CH | 673 354 | 2/1990 | |
| DE | 199 19 944 A1 | 3/2000 | |
| DE | 100 25 774 A1 | 12/2001 | |
| JP | 4-10670 | 1/1992 | |
| JP | 4-10671 | 1/1992 | |
| JP | 06028941 A | 2/1994 | |
| JP | 06090029 | 3/1994 | |
| JP | 06-090029 | * 3/1994 | ........... H01L/33/00 |
| JP | 06296043 A | 10/1994 | |
| JP | 07007185 A | * 1/1995 | ........... H01L/33/00 |
| JP | 11163412 A | 6/1999 | |
| JP | 11-346007 | 12/1999 | |
| JP | 2000323755 A | 11/2000 | |
| JP | 2001007402 A | 1/2001 | |
| JP | 6-3-2864 | 10/2004 | |

OTHER PUBLICATIONS

German Search Report Application No. 102 05 698.6.

* cited by examiner

Primary Examiner—Carl Whitehead, Jr.
Assistant Examiner—Jennifer M Dolan

(57) ABSTRACT

A light-emitting diode includes a cup component, a plurality of electrical conducting traces formed on a surface of the cup component using an MID means, a light-emitting diode chip mounted on the cup component and electrically connected to at least a first and second electrical conducting trace of the plurality of electrical conducting traces, and a first connection part connected to at least the first and second electrical conducting traces for providing electrical connections to external circuitry. The light emitting diode may also include a protective element that electrically protects the light-emitting diode chip, and the connection part may include first and second leads connected electrically to the first and second electrical conducting traces, respectively. The cup component, light emitting diode chip, protective element, leads and other components may be assembled together and molded and sealed with resin.

16 Claims, 6 Drawing Sheets

LIGHT-EMITTING DIODE AND A METHOD FOR ITS MANUFACTURE

BACKGROUND OF THE INVENTION

1. Field of the Invention

This invention relates to an assembled light-emitting diode that houses a light-emitting diode chip (hereafter referred to as an LED chip).

2. Discussion of the Background Art

Light-emitting diodes that contain a pair of leads and LED chips that are connected electrically to the leads are known conventionally and various improvements have been made for the purpose of improving their performance and manufacturing yields. Conventional examples of this type of light-emitting diode are described in Japanese Patent Nos. 2,982,553 and 2,922,977. The example described in the former document is shown in FIG. 1(a) of the figures of this application and the example described in the latter is shown in FIG. 1(b). These figures show the cross-sectional structure in the vicinity of the LED chip-mounting portion.

In the example shown in FIG. 1(a), an improvement is made for the purpose of preventing electrical short circuits between leads. As shown in FIG. 1(a), the LED chip 510 has a pair of electrodes 520 and 530 on its bottom surface and these electrodes are electrically connected by connecting means 525 and 535 such as solders to the pair of leads 560 and 570. The insulating material 595 is placed between the leads 560 and 570 for the purpose of preventing short circuits between them. This insulating material can also decide a relative position of the two leads 560 and 570.

The cup component 650, which comprises an insulator that is linked to the tip of the pair of leads 660 and 670, is shown in FIG. 1(b). The cup component 650 is placed so that it engages with the shoulders 661 and 671 that are formed in the leads 660 and 670. The reflecting surface 623 that is formed inclined to the inside surface of the apex of the cup component 650 is constructed so that it can collect the emitted light from the LED chip 610 and reflect it upwards.

According to the construction of the light-emitting diodes shown in these prior documents, the LED chips are connected to the leads 560 and 570; 660 and 670 in the vicinity of the tips of the leads 560 and 570; 660 and 670 at which the LED chips 510 and 610 are arranged, after which a resin mold is formed to protect them. In FIG. 1(b), the resin mold is shown as reference number 690. The resin material that is used for this resin mold usually has a high coefficient of thermal expansion. Consequently, in the process of forming the resin mold, relatively great thermal stress acts on the leads 560 and 570; 660 and 670. Thereby undesirable stress is applied to the LED chip itself and to the connecting component between the LED chip and the leads and can be a cause of breakage of the LED chip or a poor connection.

SUMMARY OF THE INVENTION

Consequently, the object of this invention is to provide a light-emitting diode and a method for its manufacture for preventing undesirable stress from being applied on the LED chip during the manufacturing process of the light-emitting diode, for assuring a reliability of function and for increasing the manufacturing yield.

This invention provides a light-emitting diode which is a light-emitting diode with a connecting portion for connecting between the light-emitting diode chip (LED chip) and the external circuit characterized in that it has a cup material made of an insulating material [that] for housing the said light-emitting diode chip and in that paired electrical conducting traces are printed and formed on the surface of said cup component by an MID means (Molded Interconnect Device), in that the said light-emitting diode chip is mounted on the said cup, so that it is connected to the said paired electrical conducting traces and in that the said connection part is constructed so that there is electrical conduction with the said connection part due to the fact that it is connected to the said paired electrical conducting traces.

Preferably, it also has other electronic or electrical components that are placed along the said surface of the said cup component or a circuit that contains said other electronic or electrical components.

Preferably, said other electronic or electrical components contain a protective element that electrically protects the said light-emitting diode chip and said protective element is constructed so that there is electrical conduction with the said paired electrical conducting traces.

Preferably, said other electronic or electrical components contain at least a light-emission monitoring element that can sense light emission from the said light-emitting diode chip or a heat-generation monitor element that can sense the temperature in the vicinity of the said chip component and in that the said light-emission monitoring element or the said heat-emission monitoring element is connected electrically to the other electrical conducting traces that is formed by the MID method on the said surface so that it is independent from the said paired electrical conducting traces.

Preferably, it has another connecting component that is in electrical connection with the said other electrical conducting traces and that is used for the purpose of connecting the said other electrical conducting traces to the external circuit.

Preferably, said connection part is constructed so that there is a pair of leads and so that said pair of leads and the said paired electrical conducting traces are connected electrically.

Preferably, said cup component has an engaging portion to be engaged with said pair of leads.

Preferably, said respective pair of leads contain an extension component that extends to the vicinity of the said light-emitting diode chip.

Preferably, said cup component is made of resin or a ceramic material.

Preferably, said connecting portion is constructed so that it contains a portion of the said paired electrical conducting traces.

Preferably, the said cup component contains an engaging portion to be engaged with the component in which the said light-emitting diode is held.

Preferably, several of the said light-emitting diode chips are installed and in that three or more electrical conducting traces are installed in place of the said pair of electrical conducting traces, so that they are connected with a pair of electrodes that each has.

This invention provides a method of manufacturing light-emitting diodes comprise a process of forming at least one pair of electrical conducting traces by the MID means on the surface of the cup material which is comprised of an insulating material having a cup structure, a process of monitoring the light-emitting diode chip on the bottom surface of said cup structure to produce a secondary assembly and a process of assembling the said secondary assembly together with the other components to complete the light-emitting diode.

Preferably, the process of assembling with said other parts includes a process in which the said secondary assembly is assembled together with the lead component and in which the parts are electrically connected.

Preferably, the process of assembly with the said other parts includes a process in which a resin mold is formed so that the parts are covered by resin from the outside of the said secondary assembly.

The light-emitting diode of this invention has a cup component that is comprised of an insulator such as resin or a ceramic material. The cup component has electrical conducting traces formed by means of an MID method so that they extend along its surface. The LED chip is electrically and mechanically coupled by conventional technique to these electrical conducting traces. Specifically, by mounting the LED chip on the cup component, the assembly can be handled taking the cup component as a unit. This is extremely advantageous for the working tests that are performed after mounting the LED chip. Further, the cup component can provide a reflecting surface as a single entity that reflects the emitted light from the LED chip so that it is directed upward.

In one mode of embodiment, the cup component is engaged mechanically to a pair of metal leads that extend to the exterior and is connected electrically to these leads by a known device such as a solder connection. This is an advantage in the manufacturing assembly process. As in the conventional examples, the LED chip is molded and affixed with the cup component by means of resin. However, the pair of electrodes of the LED chip are mounted on a cup material with a relatively low thermal expansion coefficient and are therefore not greatly subjected to the effects of thermal stress in the process of resin molding. Specifically, by making the coefficient of thermal expansion of the cup component less than that of the resin material for molding and greater than that of the LED chip, the effects of thermal stress on the LED chip are kept to a minimum and a large stress effect does not occur on the connecting portion between the electrical conducting traces and the leads of the cup component.

In another mode of embodiment, a structure corresponding to metal leads can be formed as a single entity with the cup material. Specifically, by this mode, the cup portion contains a linking structure with the circuit board to which the light-emitting diode is connected.

DETAILED DESCRIPTION OF THE INVENTION

The following definitions are presented to provide a better understanding of the Figures in conjunction with the following detailed description of the invention.

| Definition of symbols | |
|---|---|
| 40; 140; 240; 340 | LED chips |
| 11; 111; 211; 311 | cup components |
| 31, 33, 35; 131, 133, 135; 231, 233, 235; 331, 333 | first electrical conducting traces |
| 32, 34, 36; 132, 134, 136; 232, 234, 236; 332, 334 | second electrical conducting trace |
| 150 | protective element |
| 11, 111, 211, 311 | first lead |
| 12, 112, 212, 312 | second lead |
| 323, 324 | extended part (small projection) |

We shall now present a detailed description of a light-emitting diode that is a desirable mode of embodiment of this invention and of the method for its manufacture by reference to the appended figures.

Figure 2:
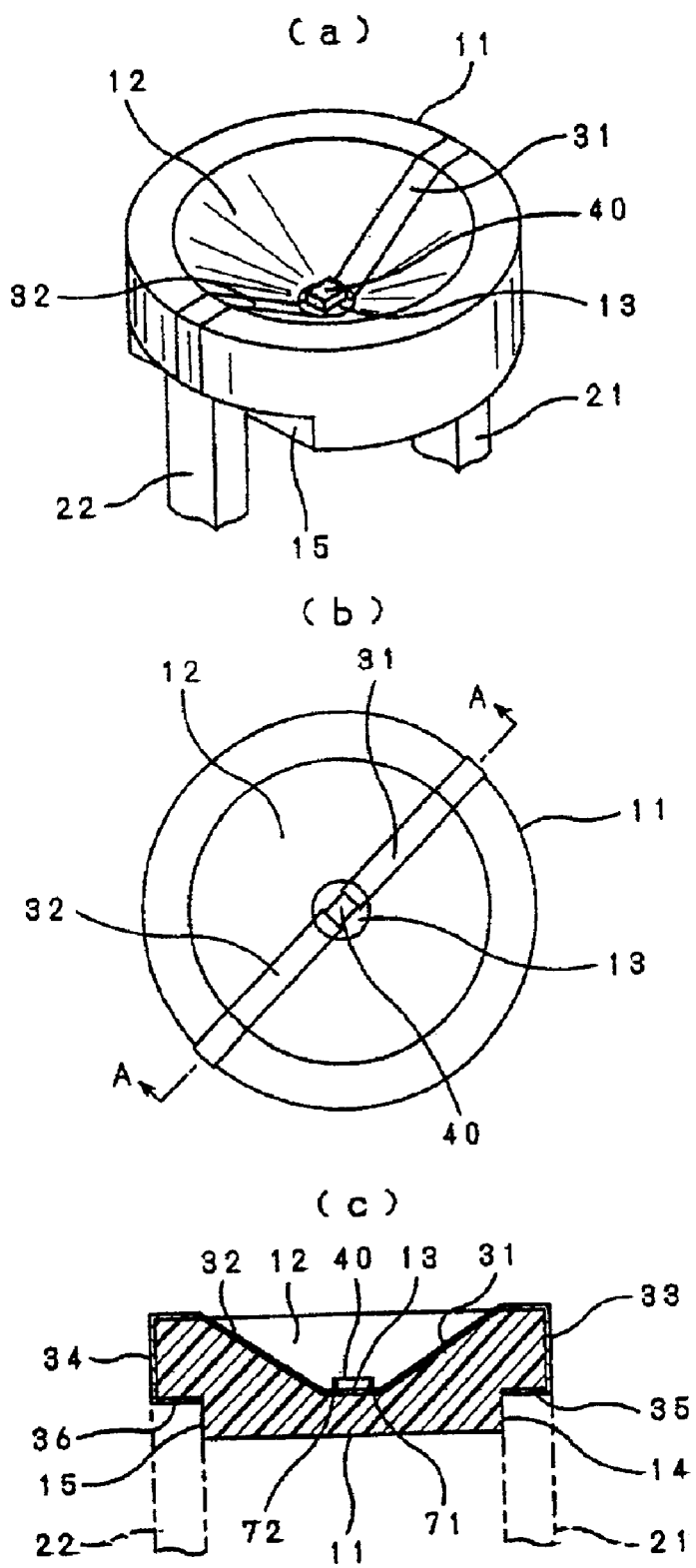
FIG. 2 is a figure that shows the structure for the light-emitting diode which is the first desirable mode of embodiment of this invention. (a) is an perspective view that shows the structure in the vicinity of the LED chip, (b) is a plane view of it and (c) is a cross-sectional view in the position along line A—A in (b).

FIG. 2 is a figure that shows the structure of a light-emitting diode that is the first desirable mode of embodiment of this invention. A light-emitting diode and a method for its manufacture is described in which, during manufacture of the light-emitting diode, the application of undesirable stress on the LED chip is prevented and reliability of function is assured. Generally, the light-emitting diode contains the cup portion 11 that is comprised of resin or a ceramic material, the LED chip 40 and a secondary assembly comprised of the leads 21 and 22 and is manufactured by molding and sealing them with resin. The paired conducting traces 31, 33, 35; and 32, 34, 36 are formed by an MID method on the surface of cup component 11. The LED chip 40 is positioned at end parts 71 and 72 of electrical conducting traces 31 and 32, and is mounted on cup component 11 and leads 21 and 22 are connected to electrical conducting traces 35 and 36 in another position.

In FIG. 2, (a) is an perspective view that shows the structure in the vicinity of the LED chip, and (b) is a plane view of it and (c) is a cross-sectional view in the position along line A—A in (b).

Figure 1:
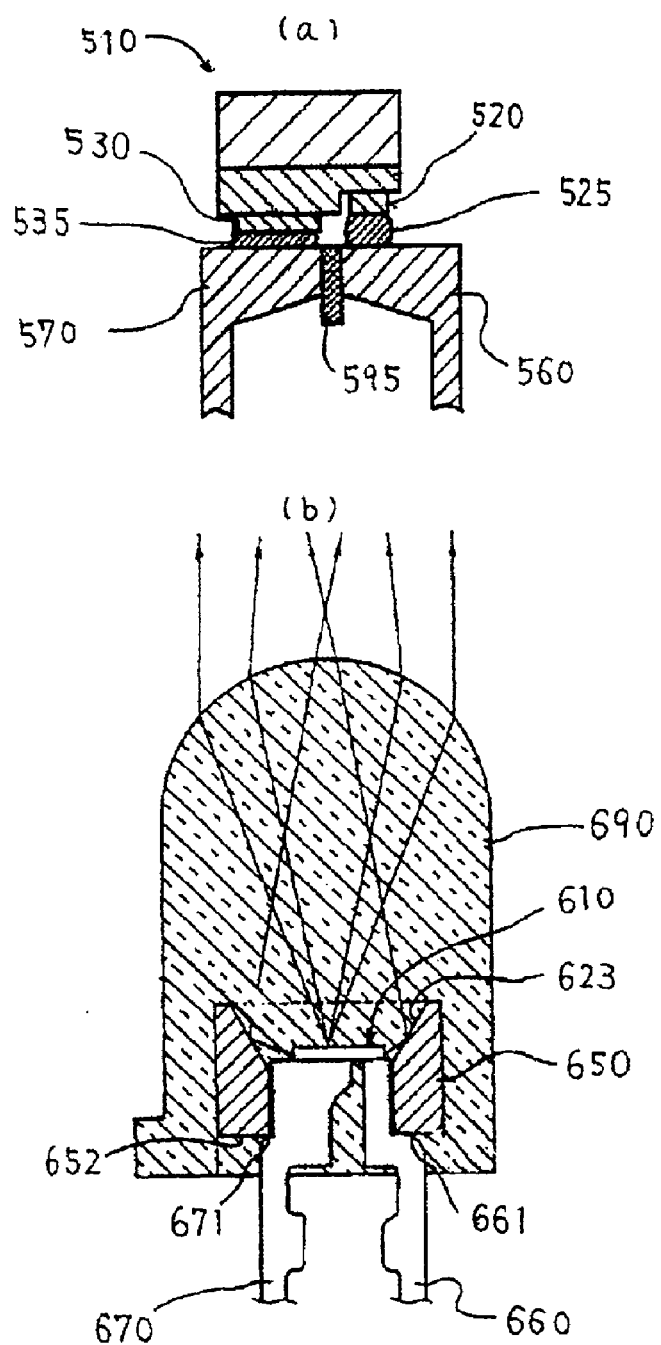
FIG. 1 is a cross-sectional view that shows the internal structure of a conventional light-emitting diode and (a) and (b) are figures that illustrate the first and second conventional technologies.

The light-emitting diode of the first preferable mode of embodiment is similar on its basic structure to that of the conventional technology shown FIG. 1(*b*) and (*c*) in that it has the pair of leads 21 and 22 and the LED chip 40 that is connected electrically to these leads. Moreover, although not shown in the figure, it contains molded resin that is installed so as to surround the vicinity of the tips of the leads shown in FIG. 2(*a*) to (*c*). The molded resin can be made in a shape of a bullet so that it ordinarily has a lens effect on the upper side.

One point of difference of the light-emitting diode of this invention from the conventional technology is the presence of the cup component 11. The cup component 11 is formed by a material such as resin or a ceramic material and is essentially a disk-shaped component. It has the reflecting surface 12 that forms a conical depression on the upper side and the bottom part 13. It also has the paired steps 14 and 15 in the lateral end positions facing the bottom side. Moreover, the cup component 11 has the electrical conducting traces 31, 33 and 35; and 32, 34, and 36 that are printed by an MID method along its surfaces. The electrical conducting traces 31, 33 and 35; and 32, 34 and 36 extend in directions facing each other on the reflecting surface 12 from the bottom 31 and bend at the lateral faces from the upper side, reaching the steps 14 and 15.

As shown in the figure, the "flip-chip" mounted type of LED chip 40 is connected by a known means such as soldering to the ends 71 and 72 of the pair of electrical conducting traces 31 and 32 on the bottom part 13. By this means, the LED chip 40 is affixed mechanically so that the emitted light is directed upward by the reflecting surface 12 and so that it is enclosed by the reflecting surface 12. When LED chip 40 is mounted on cup component 11 before the leads 21 and 22 and the cup component are connected as described subsequently, LED chip 40 can be handled by taking cup component 11 as a unit and operations are facilitated during working tests.

The tips of the pair of leads 21 and 22, which are electrically connected to LED chip 40, are placed so that they are linked to steps 14 and 15 of cup component 11 and are connected in this position by a means such as soldering to electrical conducting traces 35 and 36. In the figure, a structure is shown in which leads 21 and 22 are positioned at steps 14 and 15. For convenience in the assembly operation, a structure can be produced in which leads 21 and 22 are temporarily held in cup component 11 by a mechanical linkage relationship.

LED chip 40 and the secondary assemblies of cup component 11 and the pair of leads 21 and 22 that have been assembled in this way are subsequently affixed and protected by the resin mold, which is not shown in the figure, so that leads 21 and 22 protrude to the outside. The effect of thermal stress on LED chip 40 that is produced at this time is greatly reduced by the presence of cup component 11. Further, by forming cup component 11 with a material having a higher coefficient of thermal expansion than that of LED chip 40, there is no deleterious effect due to heat on the connection part of leads 21 and 22 and cup component 11.

By forming cup component 11 with a material of relatively high heat conductivity, the operation of the light-emitting diode can be further stabilized. In particular, when cup component 11 is formed by molding of resin, there is the advantage that the shape of reflecting surface 12 can easily be processed to the required shape.

Figure 3:
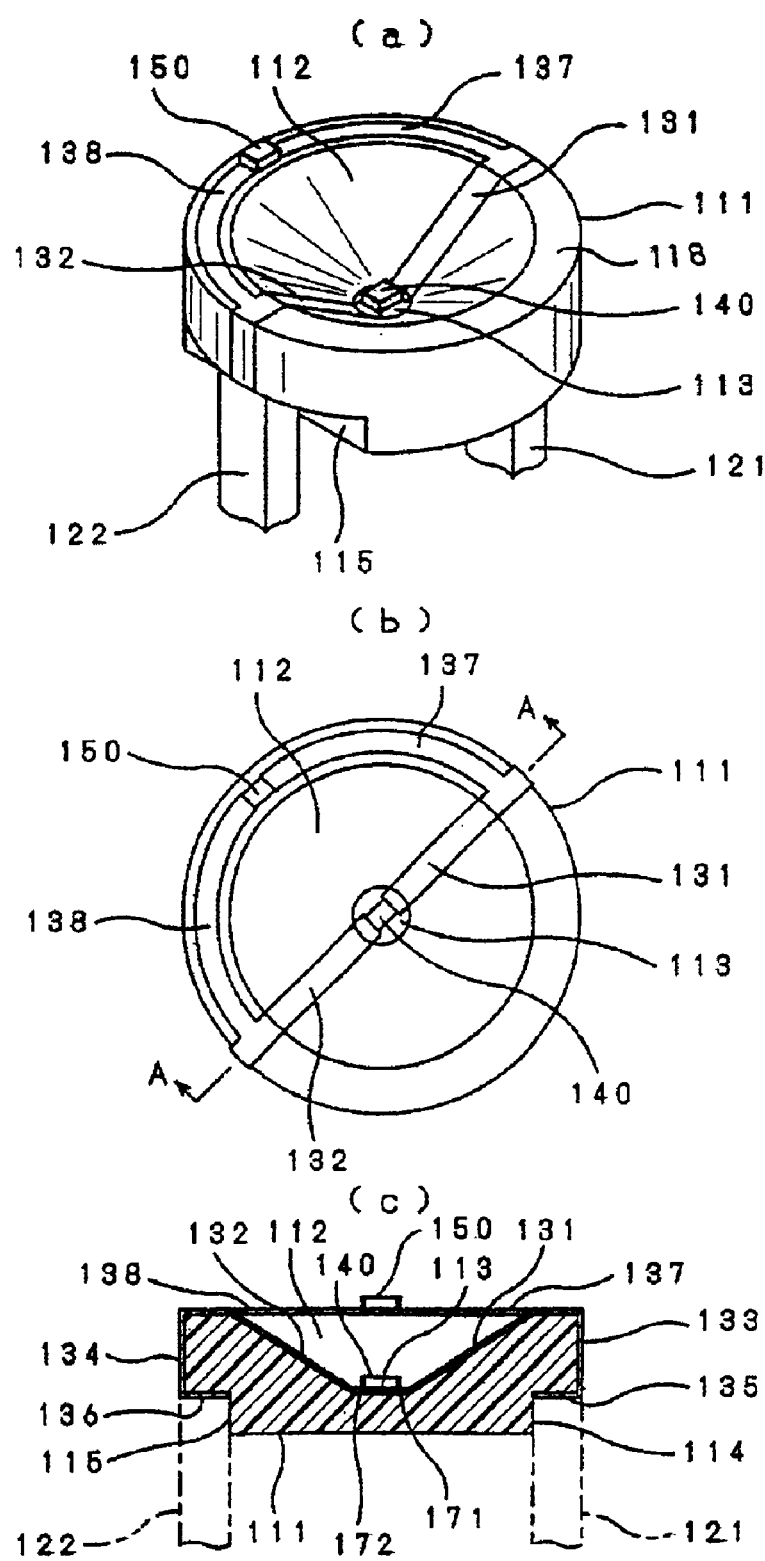
FIG. 3 is a figure that shows the structure for the light-emitting diode which is the second desirable mode of embodiment of this invention. (a) is an perspective view that shows the structure in the vicinity of the LED chip, (b) is a plane view of it and (c) is a cross-sectional view in the position along line A—A in (b).

FIG. 3 is a figure that shows the structure for the light-emitting diode that is the second desirable mode of embodiment of this invention. (a) is an perspective view that shows the structure in the vicinity of the LED chip, (b) is a plane view thereof and (c) is a cross-sectional view in the position along line A—A in (b). The point of difference of the second desirable mode of embodiment from the first desirable mode of embodiment is primarily the point that a protective element 150, such as a diode for the purpose of protection against static electricity, is installed. The structural elements that do not differ from those of the first mode of embodiment are designated by adding 100 to the reference numbers and explanations of these elements are omitted.

As shown in FIG. 3, cup component 111 also has the additional electrical conducting traces 137 and 138 that branch from electrical conducting traces 131 and 132 and that extend along the annular top surface 118 of the apex end. These electrical conducting traces 131 and 132 are also formed by an MID method. They are used for the purpose of connecting protective element 150 such as a diode. The protective element is installed for the purpose of preventing LED chip 140 from breaking as a result of the application of excessive voltage in the reverse direction of the LED chip 140. By this means, a higher working reliability of the LED chip 140 is assured. Protective element 150 can also be mounted in parallel with the process of mounting LED chip 140.

In this mode of operation, only an element protecting against static electricity is indicated as an example of an additional element. However, other elements and circuits in addition to the element protecting against static electricity may be installed. Examples of these elements and circuits include light-emission monitoring element that can sense light emission from the LED chip, heat-generation monitoring elements that can sense the temperature in the vicinity of the cup material, current-limiting resistors, circuits that contain these resistors or drive circuits. When these elements and circuits are installed, and, in particular, when electrical conducting traces that are independent from the electrical conducting traces for the LED chip are necessary, such circuitry can be formed on the cup component by an MID method. Moreover, such electrical conducting traces can be connected electrically to connecting components such the leads that are additionally installed for the purpose of connection with outside circuits.

Figure 4:
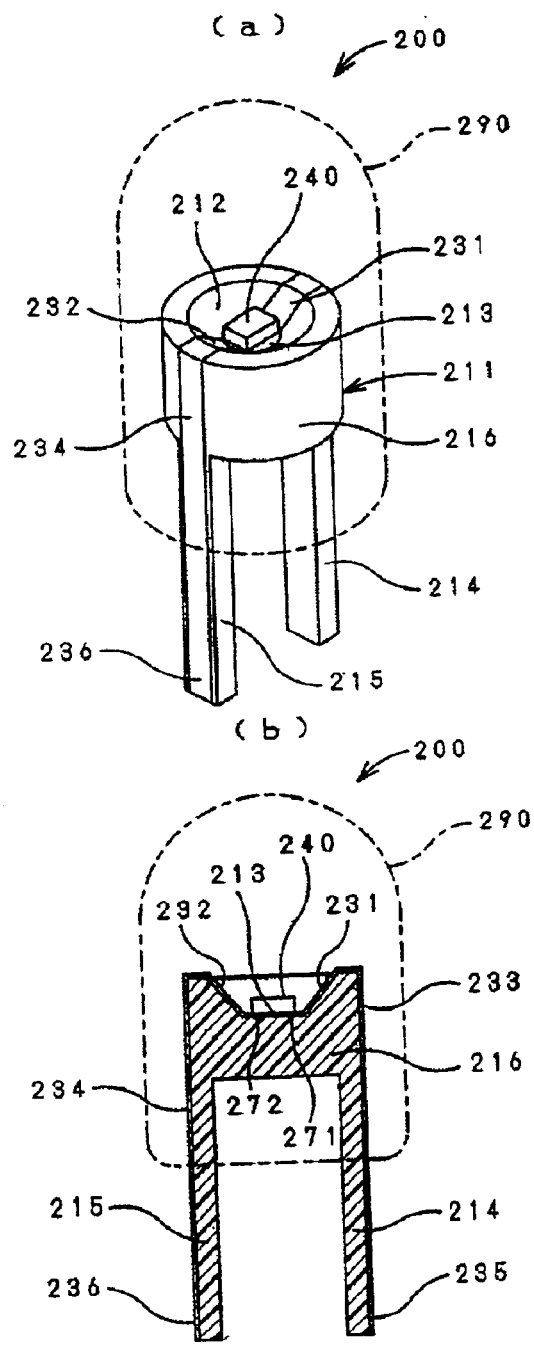
FIG. 4 is a figure that shows the structure for the light-emitting diode which is the third desirable mode of embodiment of this invention. (a) is an perspective view that shows an outline of the structure and (b) is a figure that shows a cross section.

FIG. 4 is a figure that shows the structure of a light-emitting diode which a third desirable mode of embodiment of this invention. (a) is an perspective view that shows an outline of the structure and (b) is a figure that shows a cross-sectional view. The light-emitting diodes based on the third desirable mode of embodiment differ from those of the said modes of embodiment in that leads are not necessary. Similarly, the structural elements that are used are indicated by adding 200 to the reference numbers used in the first mode of embodiment.

The light-emitting diode 200 based on this desirable mode of embodiment has the cup component 211 in which the paired electrical conducting traces 231, 233 and 235 as well as 232, 234 and 236 are formed, the LED chip 240 that is mounted in the cup component 211, and the resin mold 290 that is shown provisionally by the broken line. LED chip 240 is mounted on the bottom part 213 on the inner side of the reflecting surface 212.

The characteristic point in this mode of embodiment is that cup component 211 has the projecting structures 214 and 215 as a single entity. As shown in FIG. 4(b), projecting structures 214 and 215 have dimensions that project and extend from resin mold 290. As shown in the figure, the paired electrical conducting traces 231, 233 and 235 as well as 232, 234 and 236 that are printed and formed by the MID method so that they are connected to the LED chip extend along the outer lateral surfaces of these projecting structures 214 and 215.

Projecting structures 214 and 215 are used when light-emitting diode 200 is connected to circuit boards. Specifically, the pair of structures 214 and 215 are placed to that they pass through throughholes (not shown in the figure) that pass through the circuit board. At this time, the electrical conducting traces 235 and 236 in the vicinity of the tips of projecting structures 214 and 215 are connected by a means such as soldering with the circuit pattern on the circuit board. In order to facilitate the connecting operation with the circuit board, an additional linking structure for provisionally holding light-emitting diode 200 to the circuit board can be formed on projecting structures 214 and 215.

Figure 5:
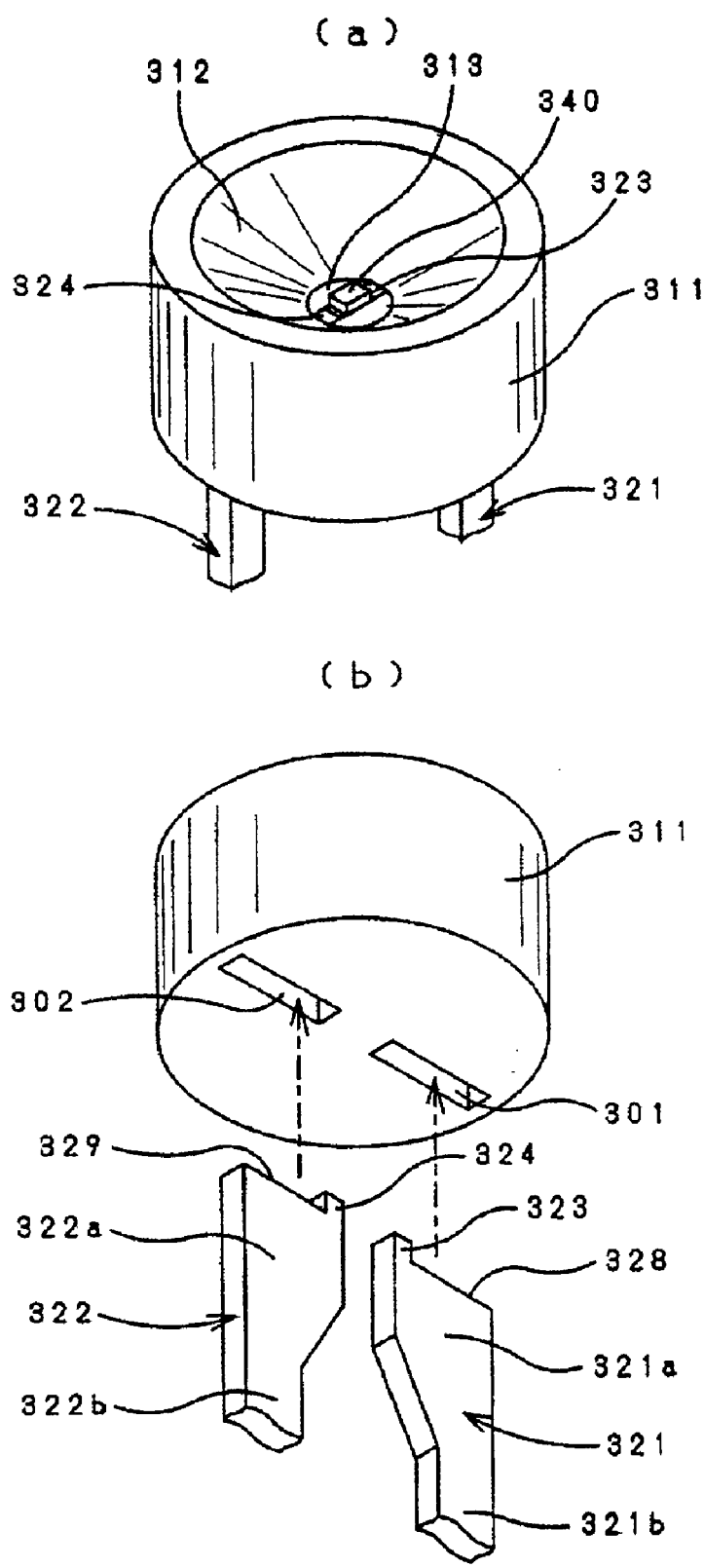
FIG. 5 is a figure that shows the structure for the light-emitting diode which is the fourth desirable mode of embodiment of this invention. (a) is an perspective view that shows the structure in the vicinity of the LED chip and (b) is an perspective view that shows the state before assembly of the leads in which the cup component is seen from the bottom side.
Figure 6:
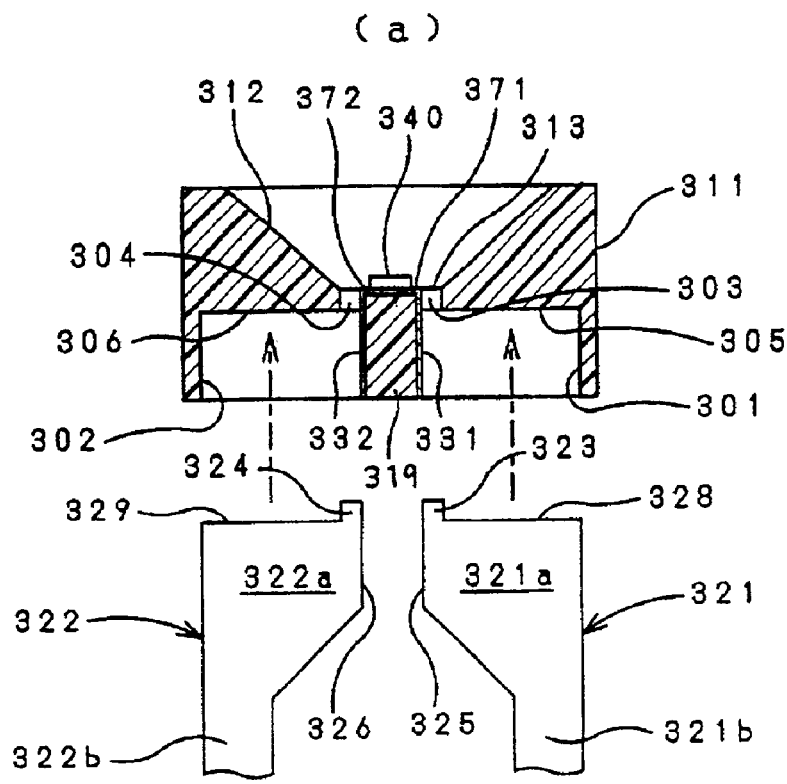
FIG. 6 is a figure that shows the structure for the light-emitting diode which is the fourth desirable mode of embodiment of this invention. (a) and (b) are cross-sectional views for illustrating the assembly of the cup component and the leads over time.
Figure 6:
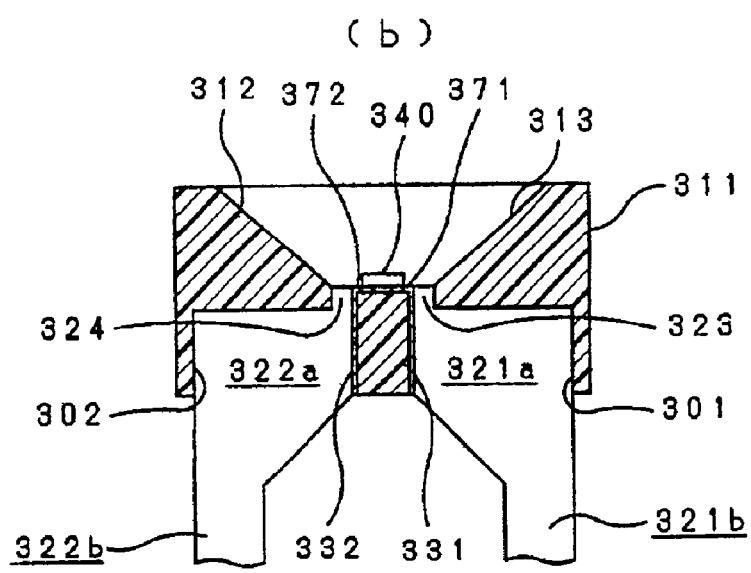

FIG. 5 and FIG. 6 show a fourth desirable mode of embodiment of this invention. FIG. 5(a) is an perspective view that shows the structure in the vicinity of the LED chip and (b) is an perspective view that shows the state before assembly of the lead when the cup component is viewed from the bottom side. FIGS. 6(a) and (b) are cross-sectional views for the purpose of illustrating the step-by-step process of assembly of the cup component and the leads.

FIG. 5(a) is a figure that is similar to FIG. 1(a) and is a partial view of the secondary assembly from which the resin mold is omitted. In this mode of embodiment as well, the following are included: the cup component 311, the LED chip 340 which is situated on its inner side and the pair of leads 321 and 322 which are assembled in cup component 311. Because the basic structure is similar to that of the first mode of embodiment, for components that have a similar function, 300 is added to the reference numbers and an explanation is omitted. The characteristic point of this mode of embodiment is that it is constituted so that the connection of the pair of leads 321 and 322 with electrical conducting traces 323, 331; 324, 332 is produced at a position close to LED chip 340.

As can be understood from FIG. 5(b) and FIG. 6(a), the pair of rectangular holes 301 and 302 are formed in the bottom surface of cup component 311. These rectangular holes 301 and 302 are made in dimensions such that they can accommodate leads 321 and 322. Electrical conducting traces 331 and 332 are formed by an MID method inside rectangular holes 301 and 302 along the partition 319 that separates rectangular holes 301 and 302. The small throughholes 305 and 306 are formed so that they are in communication with the rectangular holes 301 and 302 and so that they pass through to the bottom part 313 on which LED chip 340 is installed. As described subsequently, they are constructed so that they accommodate the small projections 323 and 324 that are formed in the tips of leads 321 and 322. Electrical conducting traces 331 and 332 are extended in a linear pattern along the partition 319 into the small throughholes 305 and 306. The electrical conducting traces 371 and 372 for mounting LED chip 340 are formed by an MID method on the bottom part 313 and electrical conducting traces 331 and 332 are constituted so that they are bonded with them.

Leads 321 and 322 have base parts 321a and 322a that form a plate shape and connecting parts 321b and 322b that extend from base parts 321a and 322a and are connected to the circuit board. Small projections 323 and 324 are established in the end parts of the inner sides of the upper lateral margins of base parts 321a and 322a. As shown in FIG. 5(b) or FIGS. 6(a) and (b), leads 321 and 322 are inserted into rectangular holes 301 and 302 from the bottom side of cup component 311. At this time, the rectangular holes may be made in dimensions whereby leads 321 and 322 can be fitted tightly into these holes and held mechanically. When they are inserted as described above, small projections 323 and 324 can be engaged with small throughholes 305 and 306 and their upper ends reach approximately the position of the height of bottom part 313. Following this insertion, leads 321 and 322 can be connected by various known methods such as soldering with the electrical conducting traces 331 and 332 in a position on the inside margin of the base parts 321a and 322a and with electrical conducting traces 371 and 372 in the position of small projections 323 and 324.

As in the modes of embodiment described above, the assembly of leads 321 and 322 may be performed after LED chip 340 has been mounted on cup component 311 in order to facilitate the handling of LED chip 340 for performing operating tests. However, the mounting of LED chip 340 on cup component 311 can also be performed at the same time as leads 321 and 322 with electrical conducting traces 323, 331; 324, 332. As in the mode of embodiment described above, the secondary assemblies (see FIG. 5(a) or FIG. 6(b)), which are completed by assembling cup component 311 with LED chip 340 and with leads 321 and 322, are further resin molded from the outer side and the light-emitting diode is completed by this means.

The advantage of the light-emitting diode based on the fourth desirable mode of embodiment is that superior heat-radiating properties are obtained. Specifically, the heat that is generated in the position of LED chip 340 during operation is readily transmitted to leads 321 and 322, by which means the heat can be radiated to the exterior by means of the leads. Consequently, even when the completed light-emitting diode has been used for a long time, its light-emitting properties do not readily deteriorate.

Above, we have described desirable modes of embodiment of this invention. However, these are strictly illustrations and modifications and changes can be made by persons skilled in the art. For example, the type of mounting of the LED is not limited to the "flip-chip" type and it may be a "flop-chip" type or another type. Further, in the various modes of embodiment, we have described the case of one LED chip that is mounted on a single cup component. However, there may also be a structure in which several LED chips are mounted in a single cup. In addition, several leads that are connected to a single cup component, or, as in the third mode of embodiment, several structures that connect to the circuit board and extend from the cup component can be formed.

What is claimed is:

1. A light-emitting diode comprising:
    a unitary cup component having a slot space extending in a vertical direction;
    a plurality of electrical conducting traces formed on a surface of said cup component using an MID means;
    a light-emitting diode chip mounted on said cup component and electrically connected to at least a first and second electrical conducting trace of said plurality of electrical conducting traces; and
    a first connection part comprising first and second leads which are partially received in said slot space of said cup component and protrude from said cup component in a direction determined by said slot space having a compensatory shape with respect to said first and second leads, wherein said first and second leads of said first connection part are connected to at least said first and second electrical conducting traces inside said slot space at the center sides of said first and second leads, respectively, wherein each of said first and second electrical conducting traces providing electrical connections to said first and second leads, and wherein said first and second leads are separate and distinct components from said first and second electric conducting traces.

2. A light-emitting diode as described in claim 1, further comprising at least other electrical components located on the surface of the cup.

3. A light-emitting diode as described in claim 2, wherein said other electrical components are electrically connected to said first and second electrical conducting traces and includes a protective element that electrically protects said light-emitting diode chip.

4. A light-emitting diode as described in claim 1, wherein said cup component includes a conductive component that links to said first and second leads.

5. A light-emitting diode as described in claim 1, wherein each of said first and second leads includes an extension component that extends to the vicinity of said light-emitting diode chip.

6. A light-emitting diode as described in claim 1, wherein said cup component comprises a resin or ceramic material.

7. A light-emitting diode as described in claim 1, wherein said first connection part comprises at least a portion of said first and second electrical conducting traces.

8. A light-emitting diode as described in claim 1, wherein said cup component further comprises a conductive component for linking to an object on which said light-emitting diode is held.

9. A light-emitting diode as described in claim 1, further comprising a plurality of light-emitting diode chips mounted on said cup component, each having a first and second electrode, wherein said plurality of electrical conducting traces includes three or more electrical conducting traces for providing electrical connections to said first and second electrodes.

10. A light-emitting diode as described in claim 9, further comprising a number of leads corresponding to said three or more electrical conducting traces, each connected to an individual one of said three or more electrical conducting traces.

11. A light-emitting diode as described in claim 1, wherein said cup component comprises an insulating material.

12. A light-emitting diode comprising:
   a unitary cup component;
   a plurality of electrical conducting traces formed on a surface of said cup component using an MID means;
   a light-emitting diode chip mounted on said cup component and electrically connected to at least a first and second electrical conducting trace of said plurality of electrical conducting traces; and
   a first connection part connected to at least said first and second electrical conducting traces for providing electrical connections to external circuitry; and
   at least other electrical components located on the surface of the cup, wherein said other electrical components include an element that monitors light emission from said light-emitting diode chip or an element that monitors heat-generation from said light-emitting diode chip, wherein said monitoring element is electrically connected to at least a third electrical conducting trace of said plurality of electrical conducting traces formed by said MID means on said surface of said cup component so that it is independent from said first and second electrical conducting traces.

13. A light-emitting diode as described in claim 12, further comprising a second connection part connected to at least said third electrical conducting trace for providing electrical connections to said external circuitry.

14. A method for the manufacture of a light-emitting diode comprising the steps of:
   forming at least one pair of electrical conducting traces by an MID method on the surface of a cup component wherein the cup includes an insulating material having a cup structure with a slot space extending at least in a vertical direction;
   mounting a light-emitting diode chip on a bottom surface of the cup structure to produce a secondary assembly; and
   assembling the secondary assembly together with other components to complete the light emitting diode, including the steps of partially receiving first and second leads in said slot space of said cup component such that said first and second leads protrude from said cup component in a direction determined by said slot space having a compensatory shape with respect to said first and second leads and electrically connecting the secondary assembly via said pair of electrical conducting traces with first and second leads, inside of said slot space at the center sides of said first and second leads, wherein said first and second leads are separate and distinct components from said first and second electric conducting traces.

15. A method for the manufacture of a light-emitting diode as described in claim 14, wherein the process of assembling the secondary assembly with other parts includes a process of resin mold formation so that said other components are covered by resin from the outside of said secondary assembly.

16. A light-emitting diode comprising:
   a unitary cup component having a slot space extending at least in a vertical direction;
   a plurality of electrical conducting traces formed on a surface of said cup component using an MID means;
   a light-emitting diode chip mounted on said cup component and electrically connected to at least a first and second electrical conducting traces of said plurality of electrical conducting traces;
   a first connection part comprising first and second leads which are partially received in said slot space of said cup component and protrude from said cup component in a direction determined by said slot space having a compensatory shape with respect to said first and second leads, wherein said first and second leads of said first connection part are connected to at least said first and second electrical conducting traces inside of said slot space at the center sides of said first and second leads, respectively, for providing electrical connections to external circuitry and wherein said first and second leads are separate and distinct components from said first and second electric conducting traces; and
   an outer mold substantially covering a bottom portion of said cup component.

* * * * *